(12) United States Patent
Fitzgerald et al.

(10) Patent No.: US 6,927,147 B2
(45) Date of Patent: Aug. 9, 2005

(54) COPLANAR INTEGRATION OF LATTICE-MISMATCHED SEMICONDUCTOR WITH SILICON VIA WAFER BONDING VIRTUAL SUBSTRATES

(75) Inventors: Eugene A. Fitzgerald, Windham, NH (US); Arthuer J. Pitera, Cambridge, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 10/603,850

(22) Filed: Jun. 25, 2003

(65) Prior Publication Data

US 2004/0072409 A1 Apr. 15, 2004

Related U.S. Application Data

(60) Provisional application No. 60/391,555, filed on Jun. 25, 2002.

(51) Int. Cl.[7] ................................................. H01L 21/30
(52) U.S. Cl. ...................................... 438/458; 438/459
(58) Field of Search .......................... 438/47, 455, 458, 438/752, 753, 936, 718, 719; 257/12, 15, 18, 22, 183, 19, 190, 191; 148/33.1, 33.4, 33.5

(56) References Cited

U.S. PATENT DOCUMENTS

| | | | |
|---|---|---|---|
| 5,374,564 A | 12/1994 | Bruel | |
| 5,462,883 A | 10/1995 | Dennard et al. | |
| 5,877,070 A | 3/1999 | Goesele et al. | |
| 5,882,987 A | 3/1999 | Srikrishnan | |
| 6,059,895 A | 5/2000 | Chu et al. | |
| 6,107,653 A | 8/2000 | Fitzgerald | |
| 6,150,239 A | 11/2000 | Goesele et al. | |
| 6,475,072 B1 | 11/2002 | Canaperi et al. | |
| 6,573,126 B2 | 6/2003 | Cheng et al. | |
| 6,723,622 B2 * | 4/2004 | Murthy et al. | ............... 438/507 |
| 6,746,902 B2 * | 6/2004 | Maa et al. | ................... 438/149 |
| 2002/0190269 A1 * | 12/2002 | Atwater et al. | ............. 257/184 |
| 2003/0013305 A1 * | 1/2003 | Sugii et al. | ................. 438/689 |
| 2004/0087119 A1 * | 5/2004 | Maa et al. | ................... 438/518 |
| 2004/0115916 A1 * | 6/2004 | Lochtefeld et al. | ......... 438/597 |
| 2004/0214434 A1 * | 10/2004 | Atwater et al. | ............. 438/689 |
| 2005/0026432 A1 * | 2/2005 | Atwater et al. | ............. 438/689 |

FOREIGN PATENT DOCUMENTS

| | | |
|---|---|---|
| DE | 101 00 194 A1 | 7/2001 |
| FR | 2 777 116 | 10/1999 |
| WO | WO 02/13342 | 2/2002 |
| WO | WO 02/15244 | 2/2002 |
| WO | WO 02/33746 | 4/2002 |

OTHER PUBLICATIONS

A, J. Alberton–Harvey, SOI : Materials to Systems, 1966 IEEE, IEDM 96–3, pp 111–118.*

"Silicon on Insulator Material Technology"; M. Bruel; Electronics Letters; Jul. 6, 1995; vol. 31, No. 14; pp. 12011202.

"Ge layer transfer to Si for photovoltaic applications"; Zahler et al., Thomas J. Watson Laboratory of Applied Physics, California Institute of Technology; pp.: 558–562.

(Continued)

Primary Examiner—Olik Chaudhuri
Assistant Examiner—Belur Keshavan
(74) Attorney, Agent, or Firm—Gauthier & Connors LLP

(57) ABSTRACT

A method of bonding lattice-mismatched semiconductors is provided. The method includes forming a Ge-based virtual substrate and depositing on the virtual substrate a CMP layer that forms a planarized virtual substrate. Also, the method includes bonding a Si substrate to the planarized virtual substrate and performing layer exfoliation on selective layers of the planarized virtual substrate producing a damaged layer of Ge. Furthermore, the method includes removing the damaged layer of Ge.

21 Claims, 12 Drawing Sheets

OTHER PUBLICATIONS

"Transfer of 3 in GaAs film on silicon substrate by proton implantation process"; Jalaguier et al., Electronics Letters; Feb. 19, 1998; vol. 34, No. 4; pp.: 408–409.

"Electron Mobility Enhancement in Strained–Si n–MOSFETs Fabricated on SiGe–on Insulator (SGOI) Substrates"; Cheng et al., IEEE Electron Device Letters; vol. 22, No. 7, Jul. 2001; pp.: 321–323.

"Preparation of Novel SiGe–Free Strained Si on Insulator Substrates"; Langdo et al., IEEE International SOI Conference; 2002; pp.: 211–212.

"Cleaning and Polishing As Key Steps For Smart–Cut SOI Process"; Moriceau et al., IEEE International SOI Conference, Oct. 1996; pp. 152–153.

"Relaxed Silicon–Germanium on Insulator Substrate By La;yer Transfer"; Cheng et al., Journal of Electronic Materials; vol. 30, No. 12; 2001 ; pp.: L37–L39.

* cited by examiner

FIG. 9A
FIG. 9B
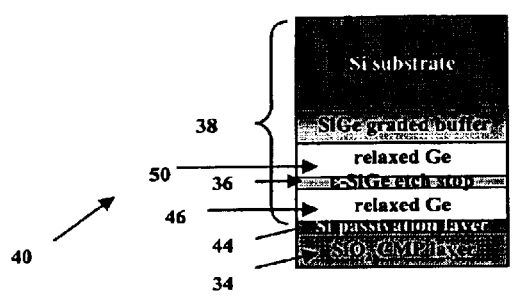
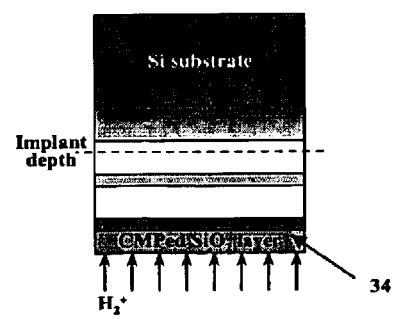
FIG. 9C
FIG. 9D
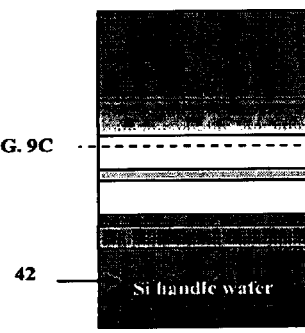
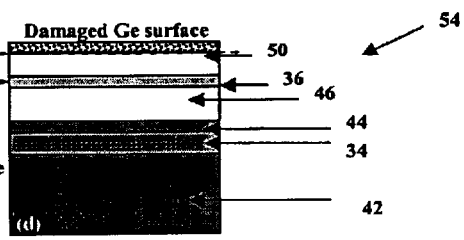
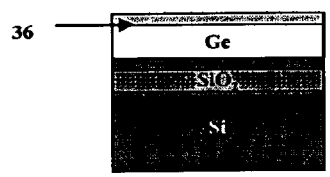
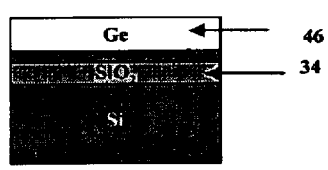
FIG. 9E
FIG. 9F

COPLANAR INTEGRATION OF LATTICE-MISMATCHED SEMICONDUCTOR WITH SILICON VIA WAFER BONDING VIRTUAL SUBSTRATES

PRIORITY INFORMATION

This application claims priority from provisional application Ser. No. 60/391,555 Jun. 25, 2002, which is incorporated herein by reference in its entirety.

BACKGROUND OF THE INVENTION

The invention relates to the field of virtual substrates, and in particular to coplanar integration of lattice-mismatched semiconductors with silicon via wafer bonding virtual substrates.

The large lattice constant mismatch between Si and GaAs/Ge precludes direct growth of the mismatched material directly on Si without nucleation of a high density of defects. One solution to this limitation is growth of compositionally graded layers where a large lattice constant mismatch is spread across several low-mismatch interfaces, thereby minimizing nucleation of threading dislocations. Compositional grading of relaxed $Si_{1-x}Ge_x$ layers of increasing Ge fraction can be used to create an arbitrary lattice constant ranging from that of Si to Ge on a bulk Si substrate. Such a structure is termed a virtual substrate.

Ge virtual substrates could further be used to integrate GaAs with Si since the lattice mismatch between Ge and GaAs is low. Unfortunately, the virtual substrate approach has the disadvantage of requiring a thick graded buffer to ensure complete relaxation of the individual mismatched layers. In the case of Ge virtual substrates, which are graded from Si to pure Ge, the buffer thickness is typically greater than 10 μm. Such thick layers 2 result in severe wafer bow due to thermal stress and complicate integration of the mismatched material with the underlying Si 4 since the device levels are not coplanar and must be interconnected across a deep step, as shown in FIG. 1.

Wafer bonding and layer transfer is another approach for integrating low-defect, lattice mismatched materials, as shown in FIG. 2. In this approach, two flat, clean wafer 6, 8 surfaces are brought into contact and annealed at high temperatures to create a strong bond. A thin layer of material is then transferred from the seed wafer to the handle wafer by means of grind and etch-back with the aid of an etch-stop layer or layer exfoliation by hydrogen ion implantation. However, the differing coefficients of thermal expansion (CTE) of Si relative to GaAs and Ge limit the annealing temperature that these bonded pairs can be exposed to. In addition, wafer size mismatch limits their use to non-leading edge fabrication facilities.

SUMMARY OF THE INVENTION

According to one aspect of the invention, there is provided a method of bonding lattice-mismatched semiconductors. The method includes forming a Ge-based virtual substrate and depositing on the virtual substrate a CMP layer which is polished to form a planarized virtual substrate. Also, the method includes bonding a Si substrate to the planarized virtual substrate and performing layer exfoliation on selective layers of the planarized virtual substrate producing a damaged layer of Ge. Furthermore, the method includes removing the damaged layer of Ge.

According another aspect of the invention, there is provided a method of bonding lattice-mismatched semiconductors. The method includes forming a Ge-based virtual substrate. Also, the method includes using the virtual substrate to form a planarized virtual substrate and bonding a Si substrate to the planarized virtual substrate. Furthermore, the method includes removing selective layers of the planarized virtual substrate associated with the Ge-based virtual substrate.

BRIEF DESCRIPTION OF THE DRAWINGS

FIGS. 9A–9F are schematic block diagrams demonstrating the Ge film transferring process;

DETAILED DESCRIPTION OF THE INVENTION

The invention provides a technique to obtain coplanar integration of high-quality, lattice-mismatched materials on large diameter substrates using a combination of virtual substrate growth and wafer bonding via a planarization layer and layer exfoliation by $H_2^+$ ion implantation. By using a virtual substrate as the seed wafer, the bond annealing temperature is not limited by the CTE mismatch of the bonded pair since bulk composition of both wafers in the bonded pair is the same. Furthermore, since the graded buffer is grown on Si, mismatched layers can be transferred to large diameter Si wafers.

Prior to wafer bonding Ge virtual substrates, several issues including wafer bow, surface roughness, low thermal budget and layer transfer must be resolved. These issues will be addressed in the following sections.

Figure 1:
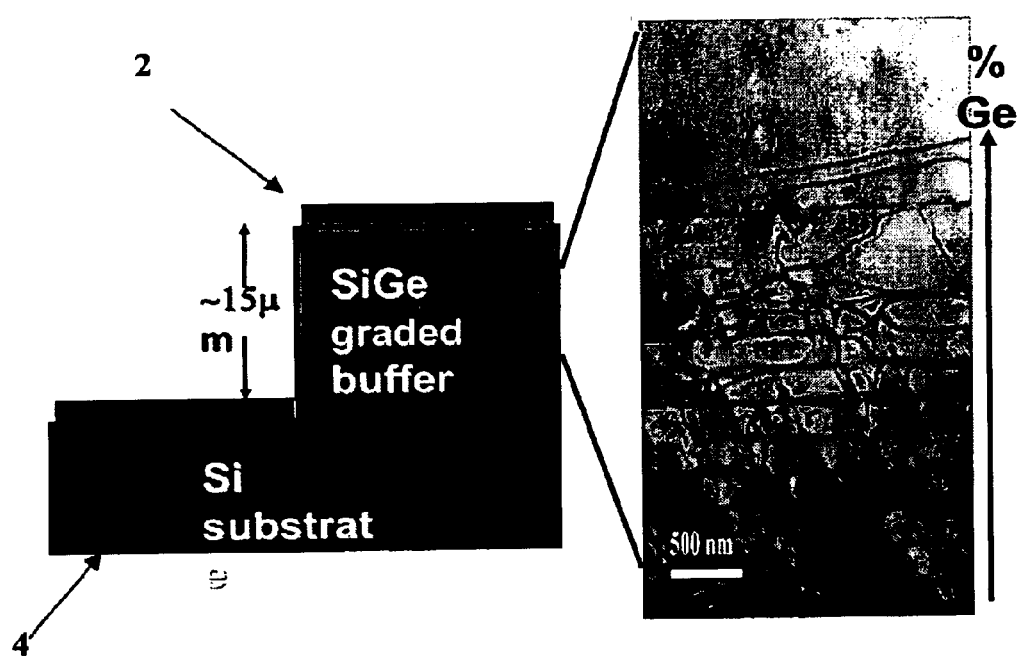
FIG. 1 is a schematic block diagram demonstrating the issue of non-coplanarity arising when SiGe virtual substrates are used to integrate Ge or GaAs with Si.
Figure 2:
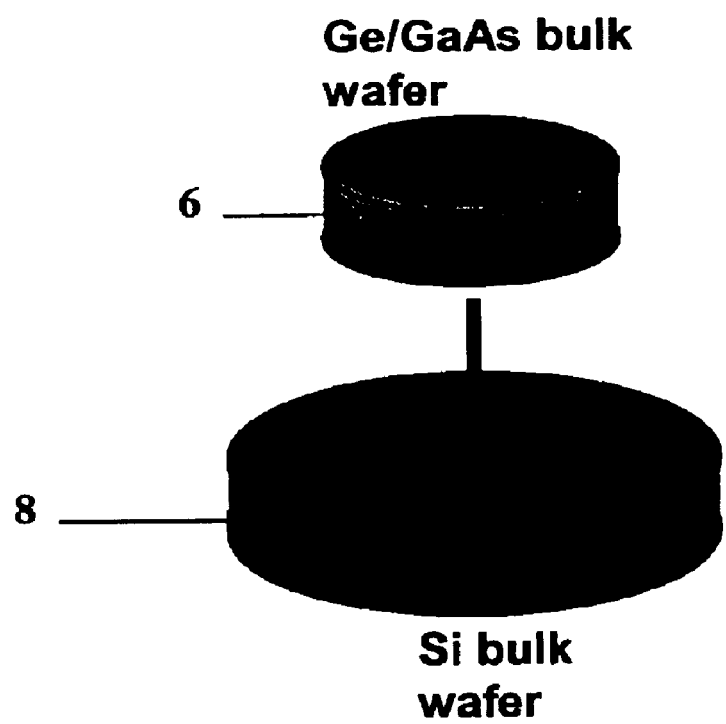
FIG. 2 is a schematic block diagram demonstrating wafer diameter mismatch between Si and Ge/GaAs.
Figure 3:
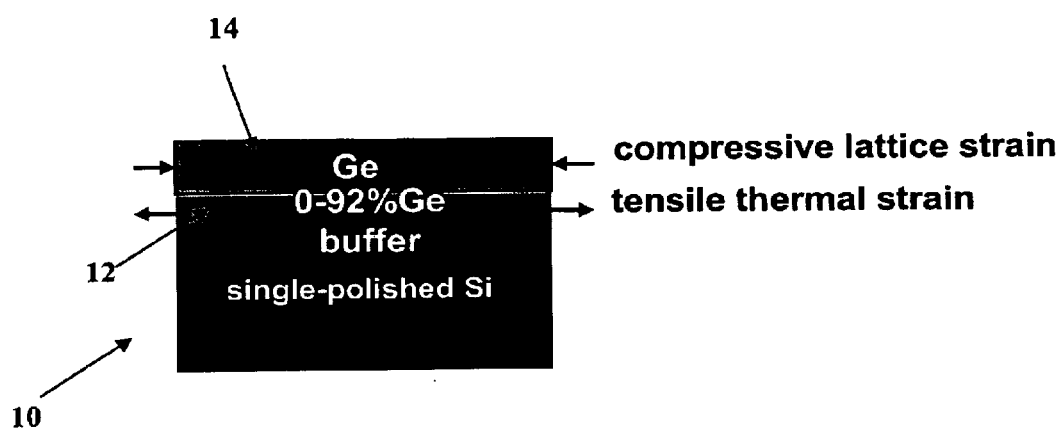
FIG. 3 is a schematic block diagram demonstrating growth of flat virtual substrates via film stress engineering.

Prior to wafer bonding, the virtual substrates must be engineered to be flat. The CTE mismatch between Si and SiGe alloys creates wafer bow, which can exceed 40 μm deflection in Ge virtual substrates fabricated with a 100 mm wafer. Although the higher CTE of Ge compared to Si results in SiGe films that are under tensile thermal strain, the larger lattice constant of SiGe can be used to grow metastable films that are compressively lattice strained. A compressively strained Ge cap 14 can be created by increasing the final composition step in the graded buffer 12 while decreasing the growth temperature to suppress dislocation glide kinetics, as shown in FIG. 3. The stress in the tensile graded buffer 12 and compressive Ge cap 14 can therefore be engineered to yield a flat substrate 10.

Figure 4:
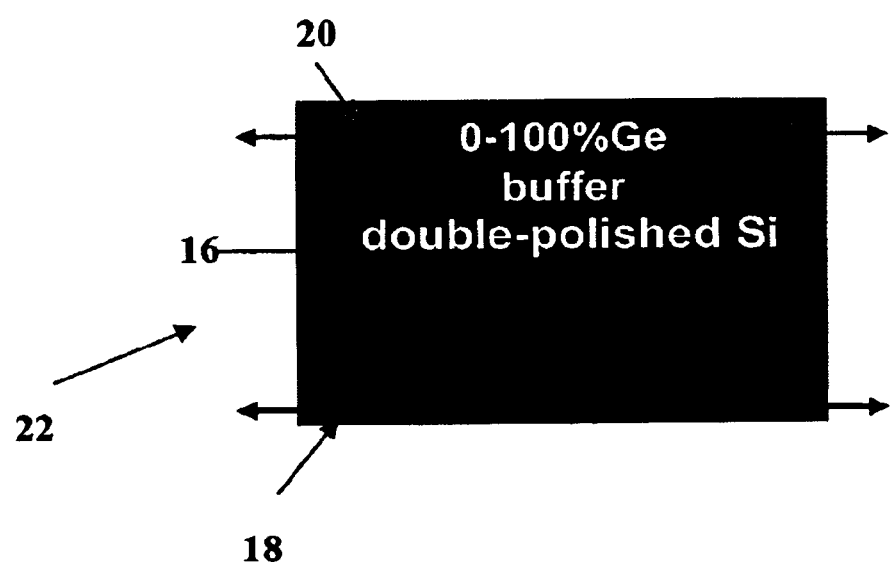
FIG. 4 is a schematic block diagram demonstrating thermal stress balancing by virtual substrates growth using double-polished wafers.

A second solution to wafer bow is used to grow the SiGe buffers 18, 20 on both sides of a double-side polished substrate 16, as shown in FIG. 4. This solution could be applied to hot-walled growth systems as film deposition must occur on both sides of the wafer. In this case, the tensile strain of the SiGe layers 18 on one side of the wafer exactly offsets that of the other 20 yielding a flat substrate 22.

Figure 5:
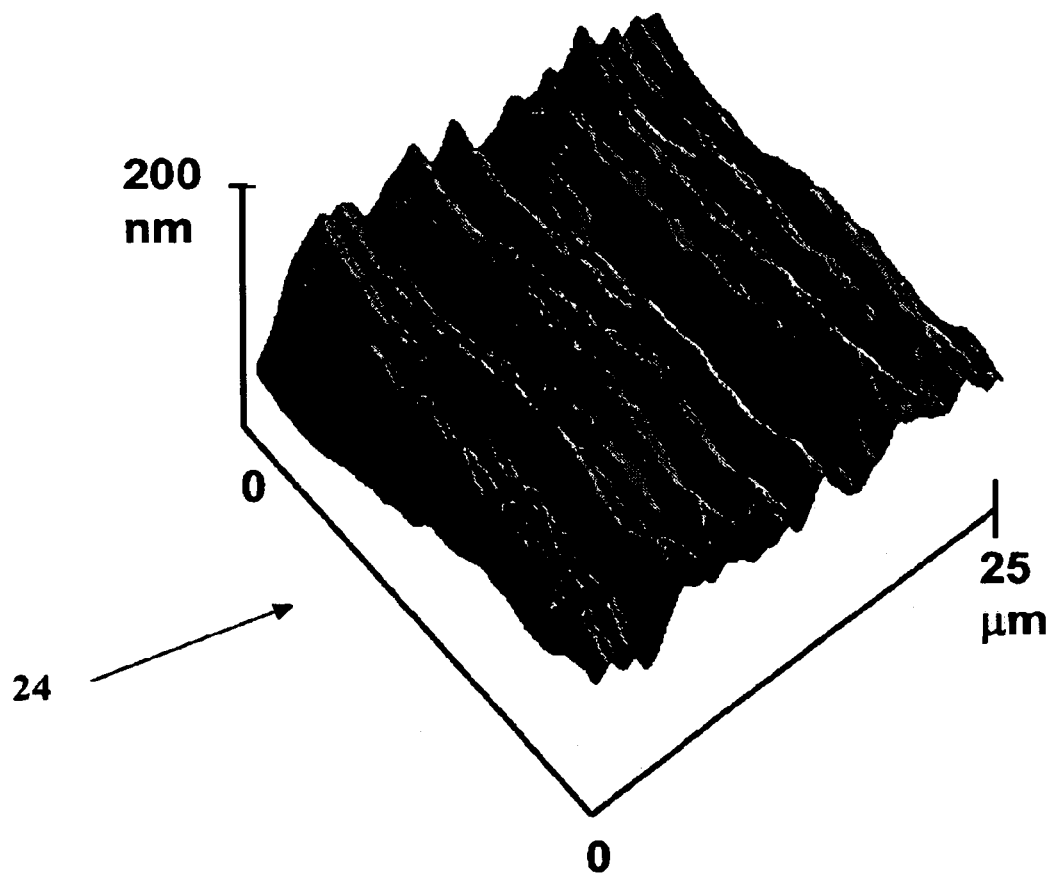
FIG. 5 is an AFM micrograph of an as-grown Ge virtual substrate.

As-grown Ge virtual substrates exhibit a crosshatch pattern characteristic to graded buffer growth. The crosshatch pattern 24 of a typical Ge virtual substrate is shown in FIG. 5.

Figure 6:
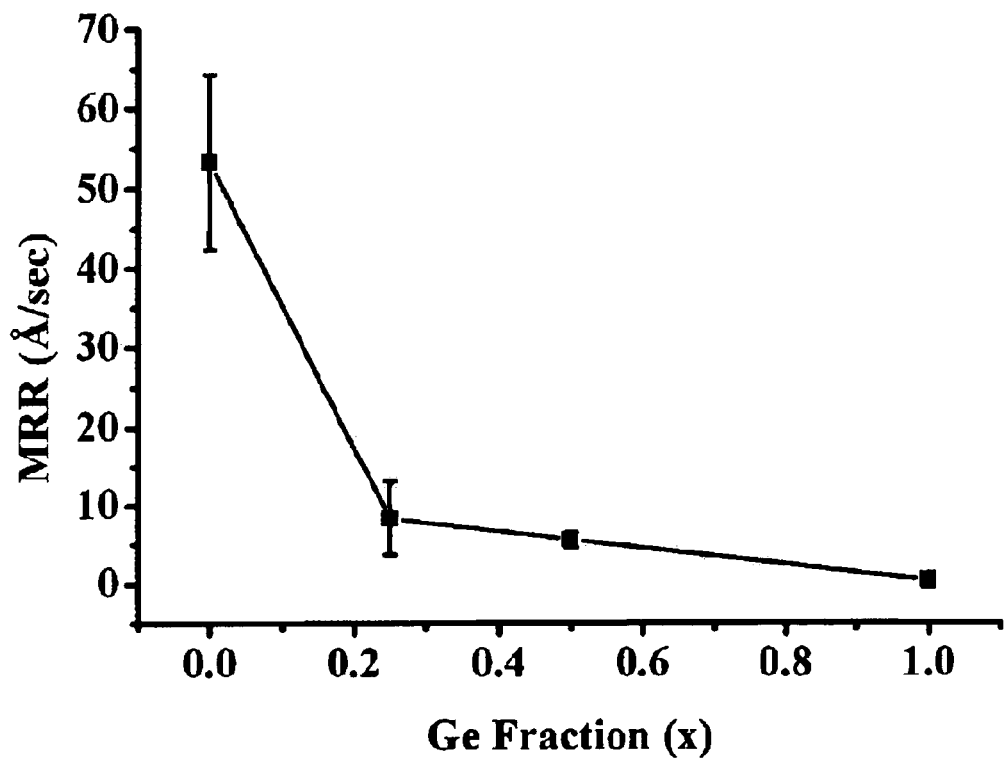
FIG. 6 is a graph demonstrating material removal rate vs. Ge fraction in $Si_{1-x}Ge_x$ films using a standard Si CMP process.

These substrates typically have a roughness of 10–15 nm RMS as measured on a 10×10 $\mu$m scale. This roughness must be reduced to less than 0.5 nm for efficient mating of the bonding surfaces. The $Si_{1-x}Ge_x$ virtual substrates with a Ge fraction of up to 60% can be readily planarized using a standard Si chemo-mechanical polishing (CMP) process consisting of a KOH-stabilized colloidal silica. However as the virtual substrate composition is increased to pure Ge, the material removal rate (MRR) decreases to less than 0.5 Å/sec making planarization of Ge highly inefficient. The decrease in polish rate with increasing Ge fraction is shown in FIG. 6.

Figure 7:
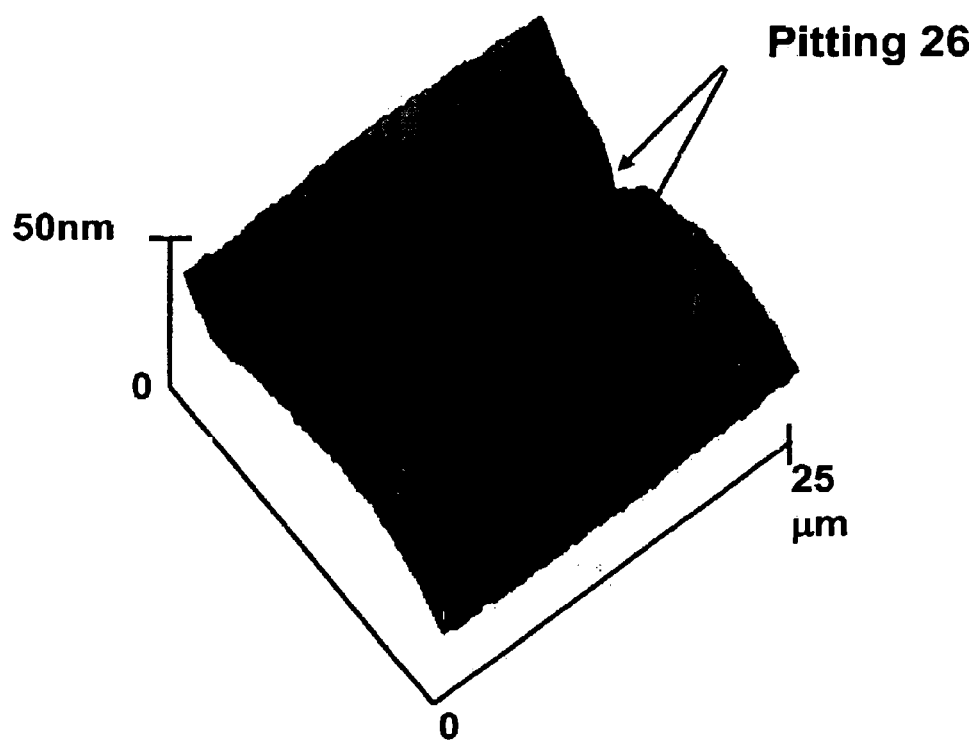
FIG. 7 is an AFM micrograph of a Ge virtual substrate polished using a standard Si CMP process.

The combination of low polish rate and anisotropic etching causes pitting due to preferential removal of material around dislocations threading to the surface. These surface pits 26 along with incomplete removal of the surface roughness can be seen in a 25×25 $\mu$m AFM scan, as shown in FIG. 7.

Furthermore, bulk Ge polishing techniques cannot be applied to Ge virtual substrates since these methods rely on chemical polishing and require removal of a large amount of material to achieve the required surface roughness. The cap thickness of Ge virtual substrates typically cannot exceed 2 $\mu$m due to thermal stress limitations.

In this process, CMP of the Ge virtual substrate is facilitated with a planarization layer consisting of an epitaxial $Si_{1-x}Ge_x$ layer or deposited oxide. This layer not only aids surface planarization, but also serves to protect the Ge surface from subsequent post-CMP and pre-bonding cleaning steps.

Figure 8:
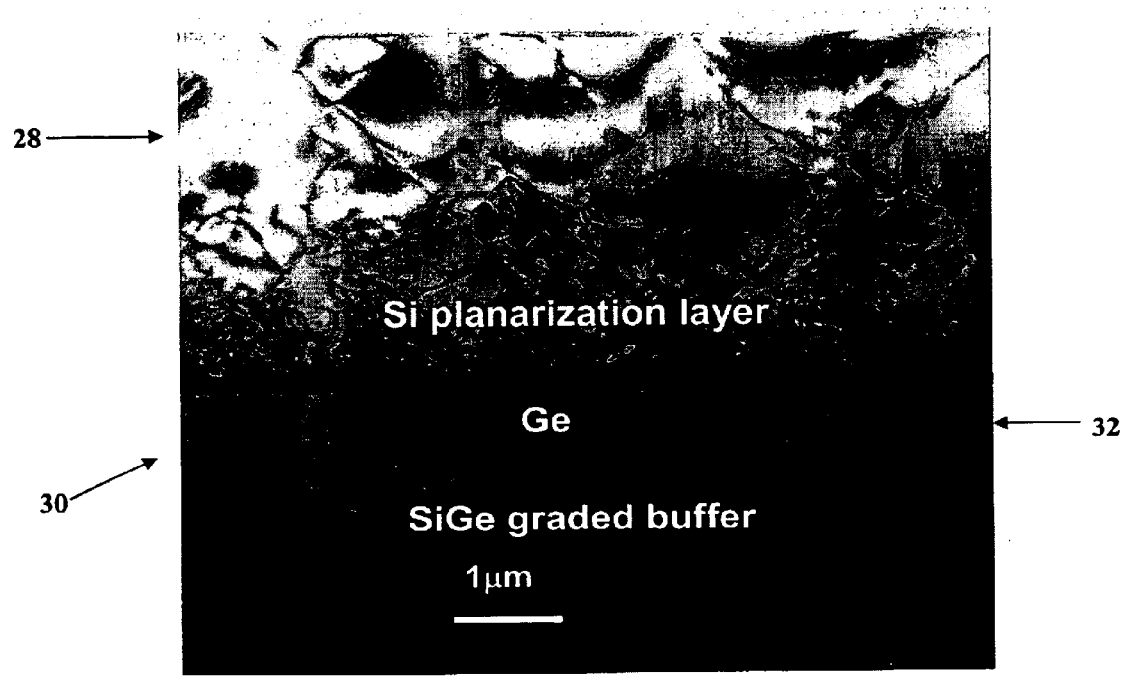
FIG. 8 is a cross-sectional TEM micrograph of an epitaxial Si CMP layer grown on a Ge virtual substrate.

An epitaxial Si layer with a nominal thickness of 2 $\mu$m is used to planarize the virtual substrate 30, as shown in FIG. 8. The 4% lattice mismatch between Si and Ge causes nucleation of a high density of dislocations in the planarization layer 28. However, these defects stay confined to the Si and do not enter the underlying Ge 32 as illustrated in the cross-sectional TEM micrograph shown in FIG. 8. It is important to realize that the Si serves only as a planarization layer and its defect content is inconsequential to the device layers, which will be fabricated on the transferred Ge. However, $SiO_2$ can also be used in planarizing a virtual substrate.

Activation of strong hydrophilic Si to Si bonding occurs at annealing temperatures exceeding 800° C. These temperatures approach the melting point of Ge, therefore it would be beneficial to reduce the annealing temperature of bonded Ge virtual substrates without sacrificing bond strength. Use of plasma-activated wafer bonding can be made to achieve high strength wafer bonds with annealing temperatures lower than 400° C.

After bonding the planarized seed wafer to the Si handle, the virtual substrate must be removed to transfer the Ge layer. In general, this can be done by mechanical thinning of the seed wafer to a final thickness of approximately 50 $\mu$m. The remaining material is then chemically etched away with the aid of a built in etch stop layer which terminates material removal at the desired thickness. A KOH or TMAH etch can be used to preferentially etch $Si_{1-x}Ge_x$ to a Ge fraction of about 20%. However, for Ge virtual substrates, a method for removing the remainder of the buffer must be devised as shown in FIGS. 9A–9F.

FIGS. 9A–9F show the Ge film transfer process incorporating an etch-stop and an oxide CMP layer 44 for use as a planarization layer. In other embodiments, the CMP layer 44 can be Si, as discussed herein. After UHVCVD growth of the virtual substrate and Ge transfer structure 38 that also includes a passivation layer composing of a material such as $Si_3N_4$ or $Si_{1-x}Ge_x$ with a nominal value of x=0 44, an $SiO_2$ layer with a nominal thickness of 7500 34 is deposited at 400° C. using low pressure CVD (LPCVD) and densified at 650° C., as shown in FIG. 9A. The wafer 40 is then CMPed reducing the oxide thickness to a nominal value of 2500 Å and implanted with $H_2^+$ to a dose ranging between $1\times10^{16}$ $cm^{-2}$ and $1\times10^{17}$ $cm^{-2}$ with a nominal dose of $4\times10^{16}$ $cm^{-2}$ shown in FIG. 9B. The implant energy should be sufficient to penetrate layers 34, 44, 46, 36 and 50. Prior to bonding the virtual substrate 38 to a Si handle wafer 42, both substrates 38, 42 are given a chemical cleaning treatment such as 3 $H_2SO_4$: 1 $H_2O_2$ for 10 minutes followed by a DI water rinse and spin dry, leaving both surfaces hydrophilic, as shown in FIG. 9C. At this point, the wafers 40, 42 may be given a plasma treatment, typically in an $O_2$ plasma, as an additional surface activation step to improve the bond strength obtained during annealing temperatures below 800° C. Next, the wafers 40, 42 are direct bonded and annealed at a nominal temperature of 250° C. for a nominal time of 12 hours to strengthen the bond. Layer exfoliation is carried out at a temperature ranging between 300 and 650° C. with a nominal temperature of 450° C., transferring the CMP layer 34 Ge 46, 50, passivation layer 44 and etch-stop 36 layers to the Si handle wafer 42, as shown in FIG. 9D. Finally, the transferred film structure 52 is etched in $H_2O_2$ to selectively remove the damaged Ge surface 50, as shown in FIG. 4E. A selective CMP step could be applied to remove the remaining etch stop layer 36, as shown in FIG. 9F.

The $Si_{0.4}Ge_{0.6}$ etch-stop layer 36 places an upper limit on the thermal budget for our film-transfer process. Annealing experiments reveal that the buried $Si_{0.4}Ge_{0.6}$ layer 36 is lost to interdiffusion after a 650° C. anneal for >6 hours, after which it no longer exhibits etch-stopping behavior. It was therefore necessary to tailor our layer transfer process to stay within the bounds of this thermal budget.

Figure 10:
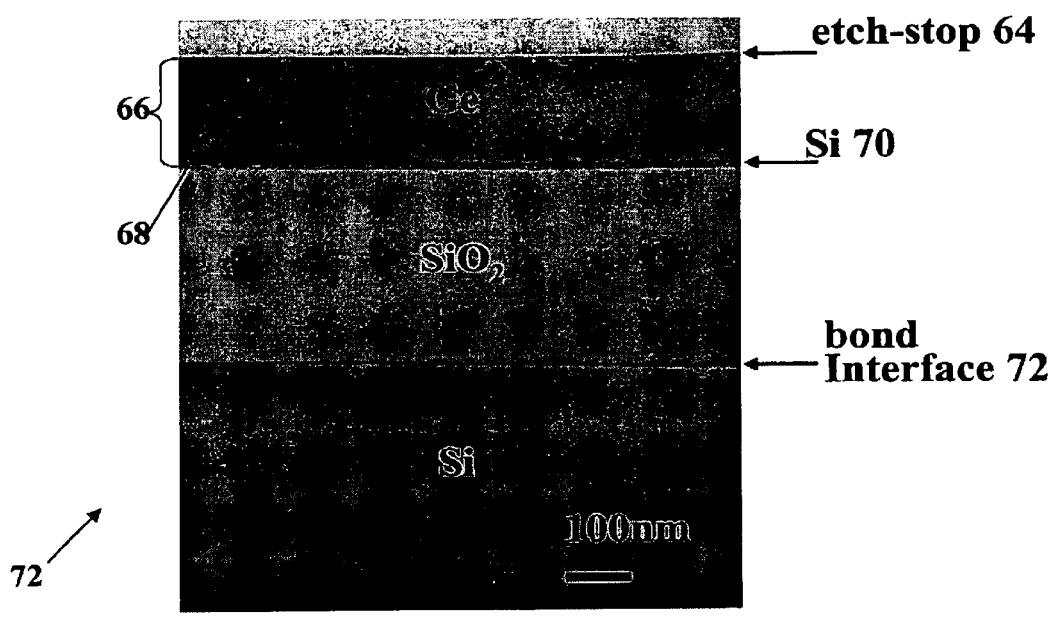
FIG. 10 is a cross-sectional TEM micrograph of the GOI structure after layer transfer and selective etching.

FIG. 10 shows a cross-sectional TEM micrograph of a GOI structure after layer transfer and selective etching. This is the first demonstration of high-quality epitaxial Ge transfer from a virtual substrate to Si. Using the buried etch-stop layer 64, the surface damage induced by the Ge exfoliation process is removed using a selective etch rather than a CMP process, allowing for very precise control of the transferred Ge thickness 66. The thickness 66 of the transferred Ge layer 68 is defined by the etch-stop layer 64, which is located at the surface of the structure 70 in FIG. 10. The thickness 66 of the transferred Ge layer 68 is 1400 Å. The reverse selectivity of our CMP process can be used to remove the Si-rich etch-stop relative to the underlying Ge device layer, leaving a damage-free Ge surface for device fabrication.

As described herein, the virtual substrates are capped with a thin Si passivation layer 70 to protect the Ge surface during wafer processing. Because this layer 70 is epitaxially grown directly on Ge, it contains a high density of defects resulting from the 4% mismatch between Si and Ge. After bonding and film transfer, this layer 70 becomes buried between the LTO and Ge layers in the final structure as seen in FIG. 11. The effect of the passivation layer 70 will be device-specific and no conclusions can be made until actual devices are fabricated. However, it is speculated that since the passivation layer 70 is very thin (<100 Å) compared to the Ge device layer 68, the defects confined to the Si will only have a small, if any effect on devices fabricated on this material. Furthermore, the Si/SiO$_2$ interface 72 is electrically superior to that of Ge/SiO$_2$, therefore the presence of the passivation layer 70 may be beneficial in this respect. In any case, for the purpose of surface passivation 70 an alternate material such as a layer of deposited Si$_3$N$_4$ instead of epitaxial Si could be used for future GOI fabrication schemes if required for devices fabricated on these substrates.

Figure 11A:
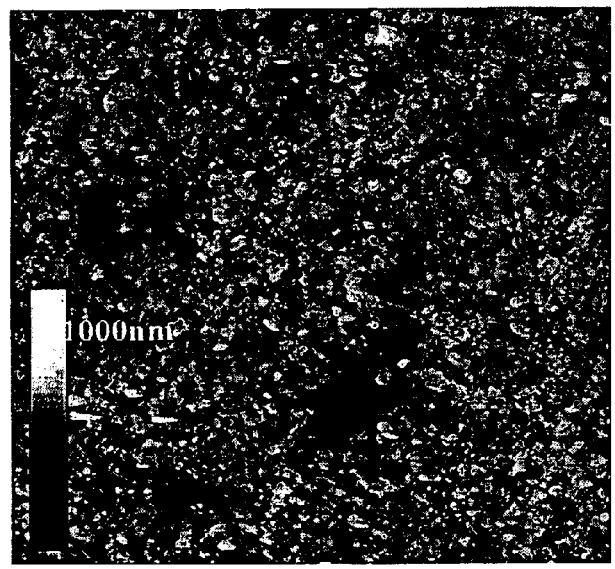
FIGS. 11A–11B are AFM micrographs demonstrating the surface morphology of the transferred Ge film before and after selective etching.
Figure 11B:
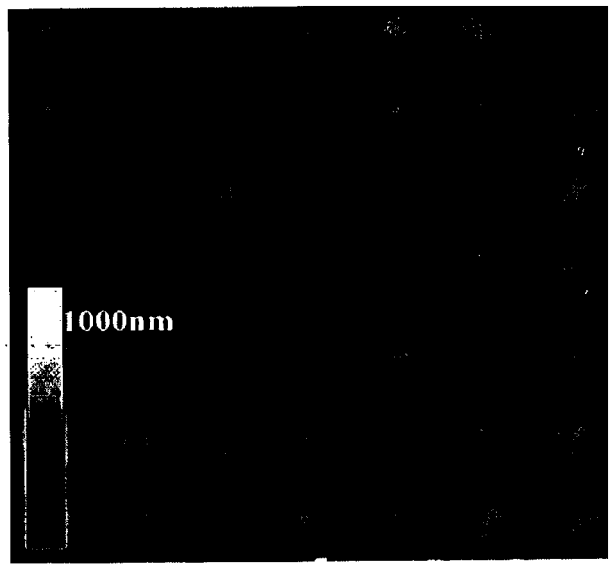

The surface morphology of the transferred film before and after selective etching is shown in FIGS. 11A–11B. FIG. 11A shows the exfoliation damage of the as-transferred Ge film. At this stage the surface of the transferred Ge layer is heavily damaged and exhibits a surface roughness >50 nm RMS, measured over a 25×25 μm area.

After selective peroxide etching, the surface roughness is reduced to <15 nm RMS and the crosshatch pattern of the original virtual substrate is revealed as shown in FIG. 11B. It is interesting to note that the re-emergence of the crosshatch is not caused by anisotropic etching but is a result of the Si$_{0.4}$Ge$_{0.6}$ etch-stop layer being grown on a crosshatched surface prior to planarization. When the peroxide etch reaches the etch-stop layer, an inverted version of the original crosshatch pattern is delineated in the transferred film. Comparing the surface morphology of the original virtual substrate with the transferred and etched Ge layer, the surface roughness is reduced from 30 to 1.4 nm RMS as determined from a 1×1 μm AFM scan.

The high surface roughness of the as-transferred film is attributed to the large stopping distance associated with the 200 keV energy used to implant H$_2^+$ for layer transfer. This exfoliation-induced roughness is completely removed after selective etching; however lower implant energies could be used to minimize the surface damage. This is particularly achievable if the thickness of the oxide CMP layer is reduced or removed entirely. The latter requires direct CMP of the Ge virtual substrate, which if done prior to growth of the etch-stop and Ge transfer layers, will result in a crosshatch-free surface morphology in the transferred Ge film. However, this optimal solution will not be possible until planarization techniques for Ge virtual substrates are perfected.

The invention uses a specific process for integrating Ge layers directly on large diameter Si wafers. However, a number of variants to this approach can be envisioned which could yield an assortment of engineered substrates. The structure fabricated in this invention could be used as-is for integration of Ge photodetectors or subsequent growth of GaAs for III–V integration. The combination of layer exfoliation and Ge-selective etching could also be useful for ultra-thin strained SiGe/Ge layers integrated directly on insulator. Strained SiGe/Ge layers have been shown to have greatly improved hole mobility over conventional Si. Further benefits could be gained by fabricating such layers on insulator. Since this process does not require CMP of the device layer, the thickness of the transferred film is defined entirely by epitaxy thus allowing for fabrication of ultra-thin layers directly on insulator.

Figure 12:
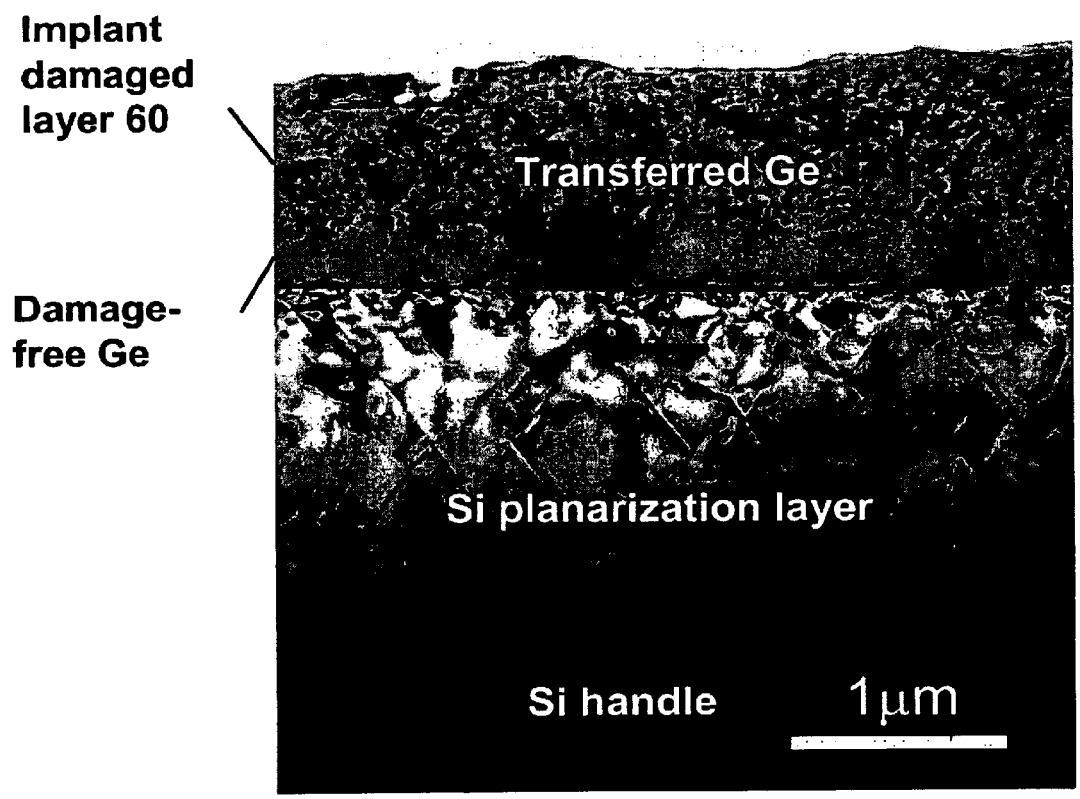
FIG. 12 is a cross-sectional TEM micrograph showing Ge on Si transferred from a Ge virtual substrate.

In a different embodiment, FIG. 12 shows a 1 μm thick Ge layer, which is transferred to Si from a Ge virtual substrate with the aid of an epitaxial Si planarization layer, but without the use of a buried etch-stop layer. The virtual substrate is created using hot-walled UHVCVD deposition of compositionally graded Si$_{1-x}$Ge$_x$ layers on a double-polished Si wafer, resulting in wafer deflection <15 μm across a 100 mm wafer. The Si planarization layer is allowed application of a standard Si CMP process to planarize the surface prior to wafer bonding.

To minimize thermal budget, both seed and handle wafers are exposed to O$_2$ plasma for 1 min and rinsed in DI water for 5 min after receiving a modified RCA clean consisting of 10 min (3H$_2$SO$_4$:1H$_2$O$_2$) and 15 min (6H$_2$O:1HCl:1H$_2$O$_2$), Layer transfer is carried out by implanting the wafers with H$_2^+$ ions at an energy of 200 keV and a dose of $4 \times 10^{16}$ cm$^{-2}$ prior to wafer bonding. After an initial 12 hour anneal at 250° C., the Ge layer was exfoliated by annealing at a temperature of 500° C. for 10 min. The layer exfoliation process left a 7000 Å damage layer 60, which could be removed by chemical etching incorporating a Si$_{1-x}$Ge$_x$ etch stop layer in the cap of the Ge virtual substrate.

III–V compounds could be similarly integrated directly on a Si substrate by growing GaAs on a Ge virtual substrate and transferring it to Si by wafer bonding and layer exfoliation. The GaAs device layer could then be used as an etch-stop to selectively remove the Ge with a hydrogen peroxide etch. Extending this process to III–V compounds, it is possible to compositionally grade in the In$_x$Ga$_{1-x}$As system for integration of semiconductor materials with lattice constants larger than Ge. These include materials such as InP and InAs, which have useful electronics and optoelectronic applications. Ultimately, wafer bonding virtual substrates will offer the flexibility of integrating virtually any material directly on large diameter Si wafers, thus eliminating the limitations of Si and dramatically increasing the functionality of CMOS for high performance electronics and optoelectronics applications.

Although the present invention has been shown and described with respect to several preferred embodiments thereof, various changes, omissions and additions to the form and detail thereof, may be made therein, without departing from the spirit and scope of the invention.

What is claimed is:

1. A method of bonding lattice-mismatched semiconductors comprising;

forming a Ge-based virtual substrate;

depositing on said virtual substrate a CMP layer that is polished to form a planarized virtual substrate;

bonding a Si substrate to said planarized virtual substrate;

performing layer exfoliation on selective layers of said planarized virtual substrate producing a damaged layer of Ge; and removing said damaged layer of Ge by selective etching.

2. The method of claim 1, wherein said virtual substrate comprises an etch-stop layer.

3. The method of claim 1, wherein said virtual substrate comprises a III–V transfer layer.

4. The method of claim 3, wherein said III–V transfer layer serves as an etch-stop.

5. The method of claim 1, wherein said virtual substrate comprises a Si$_{1-x}$Ge$_x$ passivation layer.

6. The method of claim 1, wherein said virtual substrate comprises a Si$_3$N$_4$ passivation layer.

7. The method of claim 1, wherein said CMP layer comprises an oxide.

8. The method of claim 1, wherein said CMP layer comprises Si.

9. The method of claim 2 further comprising removing said etch-stop layer after removing said damaged Ge layer.

10. The method of claim 9, wherein said etch-stop comprises $Si_{0.4}Ge_{0.6}$.

11. The method of claim 9, wherein said virtual substrate comprises at least one relaxed Ge layer and SiGe buffer.

12. A method of bonding lattice-mismatched semiconductors comprising;

forming a virtual substrate;

using said virtual substrate to form a planarized virtual substrate;

bonding a Si substrate to said planarized virtual substrate; and removing selective layers of damaged Ge after performing layer exfoliation on selective layers of said planarized virtual substrate associated with said virtual substrate.

13. The method of claim 12, wherein said virtual substrate comprises an etch-stop layer.

14. The method of claim 12, wherein said virtual substrate comprises a III–V transfer layer.

15. The method of claim 14, wherein said III–V transfer layer serves as an etch-stop.

16. The method of claim 12, wherein said virtual substrate comprises a $Si_{1-x}Ge_x$ passivation layer.

17. The method of claim 12, wherein said virtual substrate comprises a $Si_3N_4$ passivation layer.

18. The method of claim 12, wherein said planarized virtual substrate is formed using oxide.

19. The method of claim 12, wherein said wherein said planarized virtual substrate is formed using $Si_{1-x}Ge_x$.

20. The method of claim 13 further comprising removing said etch-stop layer after removing said damaged Ge layer.

21. The method of claim 20, wherein said etch-stop comprises $Si_{0.4}Ge_{0.6}$.

* * * * *

UNITED STATES PATENT AND TRADEMARK OFFICE
CERTIFICATE OF CORRECTION

PATENT NO. : 6,927,147 B2
DATED : August 9, 2005
INVENTOR(S) : Fitzgerald et al.

It is certified that error appears in the above-identified patent and that said Letters Patent is hereby corrected as shown below:

Column 1,
Line 5, please insert the following:
-- This invention was made with government support under Grant Number N66001-00-1-8954, awarded by the Navy. The government has certain rights in the invention. --.

Signed and Sealed this

Eighth Day of November, 2005

JON W. DUDAS
*Director of the United States Patent and Trademark Office*